US007263154B2

(12) United States Patent
Hsu et al.

(10) Patent No.: US 7,263,154 B2
(45) Date of Patent: Aug. 28, 2007

(54) METHOD AND APPARATUS FOR ENABLING FAST CLOCK PHASE LOCKING IN A PHASE-LOCKED LOOP

(75) Inventors: Tse-Hsiang Hsu, Hsin-Chu (TW); Ding-Jen Liu, Hsin-Chu (TW); Jong-Woei Chen, Hsin-Chu (TW); Chih-Cheng Chen, Hsin-Chu (TW)

(73) Assignee: Mediatek, Inc., Hsinchu (TW)

( * ) Notice: Subject to any disclaimer, the term of this patent is extended or adjusted under 35 U.S.C. 154(b) by 786 days.

(21) Appl. No.: 10/680,636

(22) Filed: Oct. 7, 2003

(65) Prior Publication Data

US 2004/0088619 A1 May 6, 2004

(30) Foreign Application Priority Data

Oct. 9, 2002 (TW) .............................. 91123350 A

(51) Int. Cl.
*H03D 1/24* (2006.01)
*H03L 7/06* (2006.01)

(52) U.S. Cl. ...................................... 375/376; 327/156

(58) Field of Classification Search ................ 375/373, 375/374, 376; 331/1 A, 1 R, 18, 25; 327/144, 327/147, 148, 150, 152, 156, 157, 160, 162, 327/163

See application file for complete search history.

(56) References Cited

U.S. PATENT DOCUMENTS

| | | | | |
|---|---|---|---|---|
| 6,442,225 | B1 * | 8/2002 | Huang | 375/376 |
| 6,583,674 | B2 * | 6/2003 | Melava et al. | 331/16 |
| 6,815,987 | B2 * | 11/2004 | Hsu et al. | 327/156 |
| 2002/0090045 | A1 * | 7/2002 | Hendrickson | 375/376 |

* cited by examiner

*Primary Examiner*—Betsy L. Deppe
(74) *Attorney, Agent, or Firm*—Thomas, Kayden, Horstemeyer & Risley

(57) ABSTRACT

In a method and apparatus for enabling fast clock phase locking in a phase-locked loop, a sampling clock generator generates sampling clock signals in response to an oscillator output of the phase-locked loop. A detector unit samples an input digital signal to the phase-locked loop at clock edges of the sampling clock signals to obtain multiple sampling points of the input digital signal, and compares logic levels of each temporally adjacent pair of the sampling points to detect presence of a logic level transition in the input digital signal. A selector unit is controlled by the detector unit to select one of the sampling clock signals, which has one of the clock edges thereof defining an interval that was detected to have occurrence of the logic level transition in the input digital signal, and which is subsequently provided to the phase-locked loop as an input phase-locking clock signal.

15 Claims, 7 Drawing Sheets

4
LOOP FILTER
$I_{cp}$
44
VCO
43
CHARGE PUMP
51
UP
DN
42
PHASE DETECTOR
41
SAMPLING CLOCK GENERATOR
521
DELAY CIRCUIT
SIGNAL PROCESSING CIRCUIT
SELECTOR UNIT
53
52
522
$S_{Data}$
5

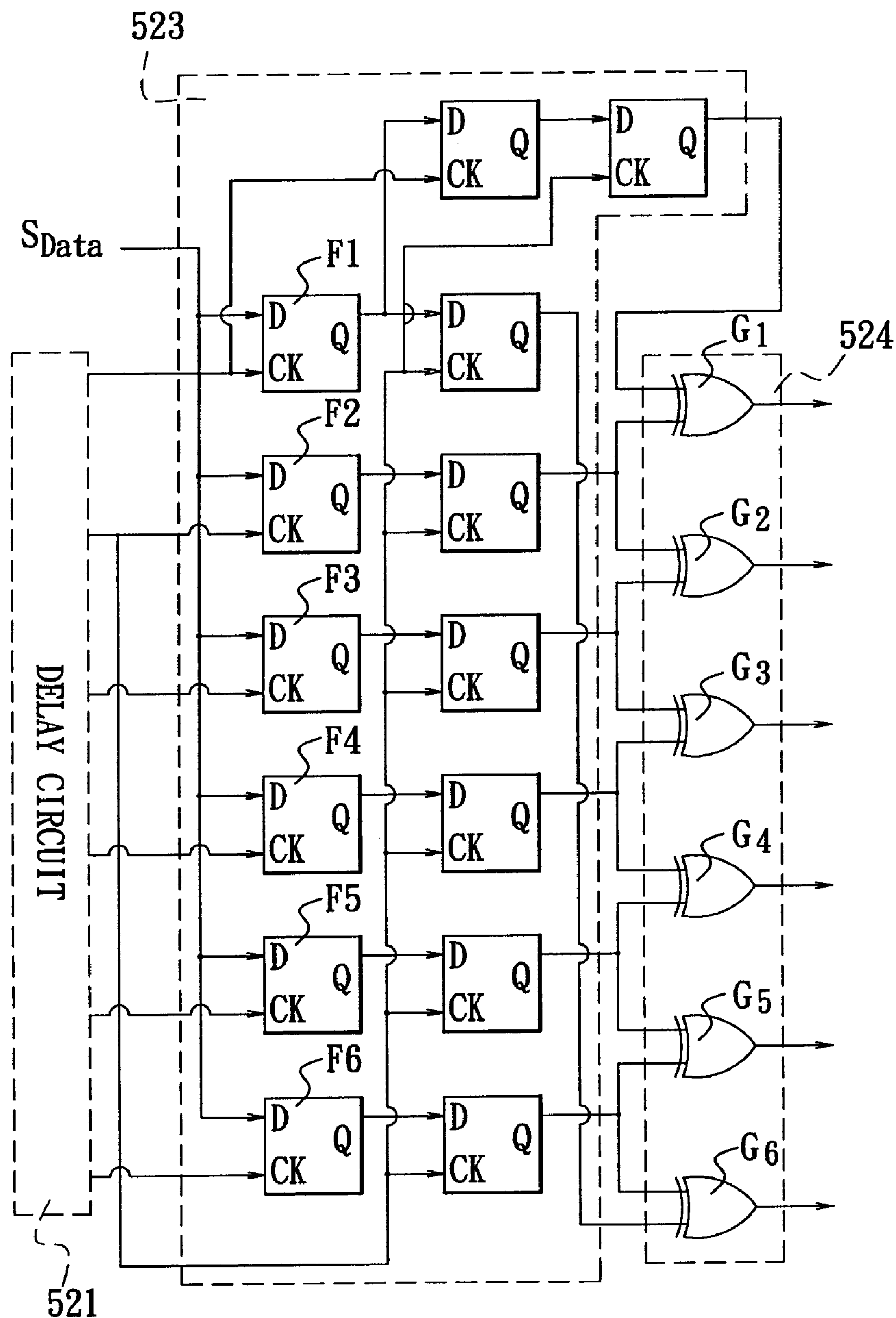
F I G. 4

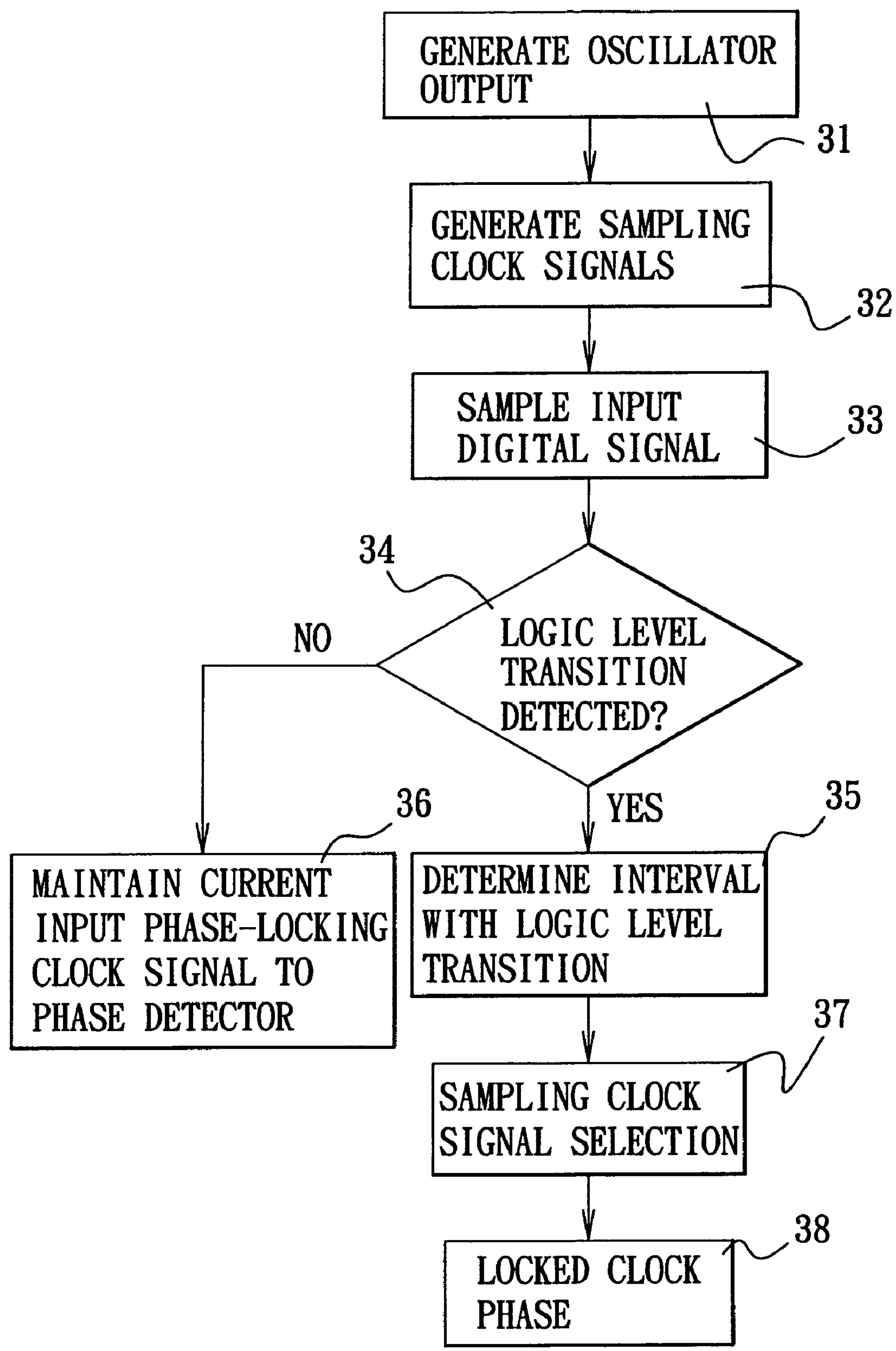
F I G. 7

METHOD AND APPARATUS FOR ENABLING FAST CLOCK PHASE LOCKING IN A PHASE-LOCKED LOOP

CROSS-REFERENCE TO RELATED APPLICATION

This application claims priority of Taiwanese application no. 091123350, filed on Oct. 9, 2002.

BACKGROUND OF THE INVENTION

1. Field of the Invention

The invention relates to a method and apparatus for clock phase locking in a phase-locked loop, more particularly to a method and apparatus for enabling fast clock phase locking in a phase-locked loop.

2. Description of the Related Art

Referring to FIG. 1, a typical rewritable digital versatile disc (hereinafter referred to as DVDRAM) 1 is shown to include a plurality of adjacent header regions 12 and record regions 11. Each header region 12 precedes a corresponding record region 11, and includes package headers and packet headers that describe data recorded in the corresponding record region 11. When reading binary data of digital signals recorded in the DVDRAM 1, clock phase locking of the digital signals must be performed first through a phase-locked loop. Referring to FIG. 2, a typical phase-locked loop 2 is shown to include a phase detector 21, a charge pump 22 coupled to the phase detector 21, a loop filter 23 coupled to the charge pump 22, a voltage controlled oscillator (VCO) 24 coupled to the loop filter 23, and a frequency divider 25 interconnecting the voltage controlled oscillator 24 and the phase detector 21. During operation, an input digital signal (IN) associated with the DVDRAM 1, together with a reference clock signal (CLK) from the frequency divider 25, are provided to the phase detector 21. When the reference clock signal (CLK) overruns the input digital signal (IN), the phase detector 21 either provides ascending pulses (UP) with narrower widths or descending pulses (DN) with wider widths to the charge pump 22. At this time, the charge pump 22 generates a positive current output ($I_{cp}$) that is integrated by the loop filter 23 to result in a descending voltage ($V_{ct}$) for controlling the voltage controlled oscillator 24 to lower the frequency of the reference clock signal (CLK) generated by the frequency divider 25. On the other hand, when the reference clock signal (CLK) underruns the input digital signal (IN), the phase detector 21 either provides ascending pulses (UP) with wider widths or descending pulses (DN) with narrow widths to the charge pump 22. At this time, the charge pump 22 generates a negative current output ($I_{cp}$) that is integrated by the loop filter 23 to result in an ascending voltage ($V_{ct}$) for controlling the voltage controlled oscillator 24 to raise the frequency of the reference clock signal (CLK) generated by the frequency divider 25. Therefore, through phase adjustment by the aforesaid phase-locked loop 2, the phase of the reference clock signal (CLK) will gradually converge to that of the input digital signal (IN) such that the current output ($I_{cp}$) eventually reaches zero, which indicates a locked clock phase condition.

Nevertheless, since the record regions 11 and the header regions 12 may have blank areas with no data recorded therein, such as areas 121, 122 in a header region 12 and areas 111, 112 in a record region 11 as shown in FIG. 2, recorded areas of the DVDRAM 1 are actually discontinuous such that the clock phase fluctuates irregularly when reading the DVDRAM 1. As a result, the reference clock signal (CLK) from the frequency divider 25 will have a rather large phase difference with the input digital signal (IN), thereby requiring a relatively long amount of time for clock phase locking.

SUMMARY OF THE INVENTION

Therefore, the object of the present invention is to provide a method and apparatus for enabling fast clock phase locking in a phase-locked loop.

According to one aspect of the present invention, there is provided a method for enabling fast clock phase locking in a phase-locked loop. The phase-locked loop includes a phase detector for receiving an input digital signal associated with a rewritable digital versatile disc and an input phase-locking clock signal, and a voltage controlled oscillator that generates an oscillator output. The method comprises the steps of:

- in response to the oscillator output, obtaining multiple sampling points of the input digital signal, wherein temporally adjacent ones of the sampling points are spaced apart from each other by an interval;
- comparing logic levels of each temporally adjacent pair of the sampling points to detect presence of a logic level transition in the input digital signal; and
- providing an adjusted input phase-locking clock signal for replacing a current input phase-locking clock signal to the phase detector, the adjusted input phase-locking clock signal corresponding to one of the sampling points in the temporally adjacent pair that was detected to have the logic level transition occurring in the interval of the temporally adjacent pair.

According to another aspect of the present invention, there is provided a method for enabling fast clock phase locking in a phase-locked loop. The phase-locked loop includes a phase detector for receiving an input digital signal associated with a rewritable digital versatile disc and an input phase-locking clock signal, and a voltage controlled oscillator that generates an oscillator output. The method comprises the steps of:

- in response to the oscillator output, generating a number (N) of sampling clock signals;
- sampling the input digital signal at clock edges of the sampling clock signals to obtain multiple sampling points of the input digital signal, wherein temporally adjacent ones of the sampling points are spaced apart from each other by an interval;
- comparing logic levels of each temporally adjacent pair of the sampling points to detect presence of a logic level transition in the input digital signal; and
- selecting one of the sampling clock signals that is to be provided to the phase detector as the input phase-locking clock signal, the selected one of the sampling clock signals having one of the clock edges thereof defining the interval that was detected to have occurrence of the logic level transition in the input digital signal.

According to yet another aspect of the present invention, there is provided an apparatus for enabling fast clock phase locking in a phase-locked loop. The phase-locked loop includes a phase detector for receiving an input digital signal associated with a rewritable digital versatile disc and an input phase-locking clock signal, and a voltage controlled oscillator that generates an oscillator output. The apparatus comprises a sampling clock generator, a detector unit, and a selector unit.

The sampling clock generator is adapted to receive the oscillator output from the voltage controlled oscillator, and generates a number (N) of sampling clock signals in response to the oscillator output.

The detector unit is coupled to the sampling clock generator and is adapted to receive the input digital signal. The detector unit samples the input digital signal at clock edges of the sampling clock signals to obtain multiple sampling points of the input digital signal. Temporally adjacent ones of the sampling points are spaced apart from each other by an interval. The detector unit further compares logic levels of each temporally adjacent pair of the sampling points to detect presence of a logic level transition in the input digital signal.

The selector unit is coupled to the sampling clock generator and the detector unit, and is controlled by the detector unit to select one of the sampling clock signals from the sampling clock generator. The selected one of the sampling clock signals has one of the clock edges thereof defining the interval that was detected by the detector unit to have occurrence of the logic level transition in the input digital signal. The selector unit is further adapted to provide the selected one of the sampling clock signals to the phase detector as the input phase-locking clock signal.

BRIEF DESCRIPTION OF THE DRAWINGS

Other features and advantages of the present invention will become apparent in the following detailed description of the preferred embodiment with reference to the accompanying drawings, of which:

FIG. 4 is a schematic circuit block diagram to illustrate a detector unit of the preferred embodiment;

FIG. 7 is a flowchart to illustrate the preferred embodiment of a method for enabling fast clock phase locking in a phase-locked loop according to the present invention.

DETAILED DESCRIPTION OF THE PREFERRED EMBODIMENT

Figure 1:
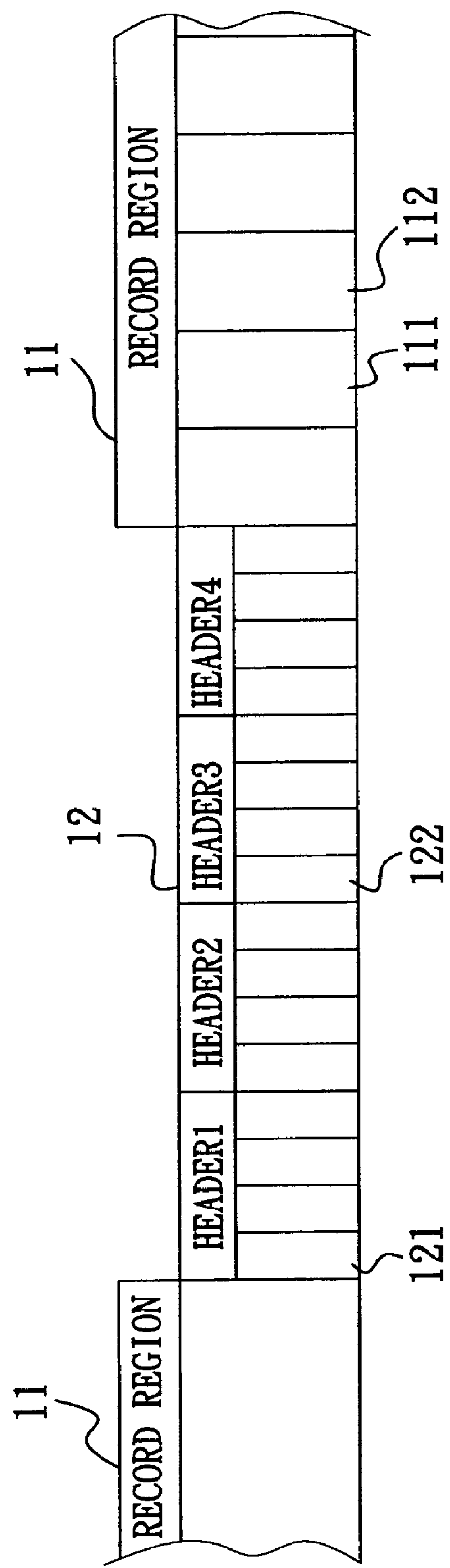
FIG. 1 is a schematic diagram to illustrate record regions and header regions of a conventional DVDRAM.
Figure 2:
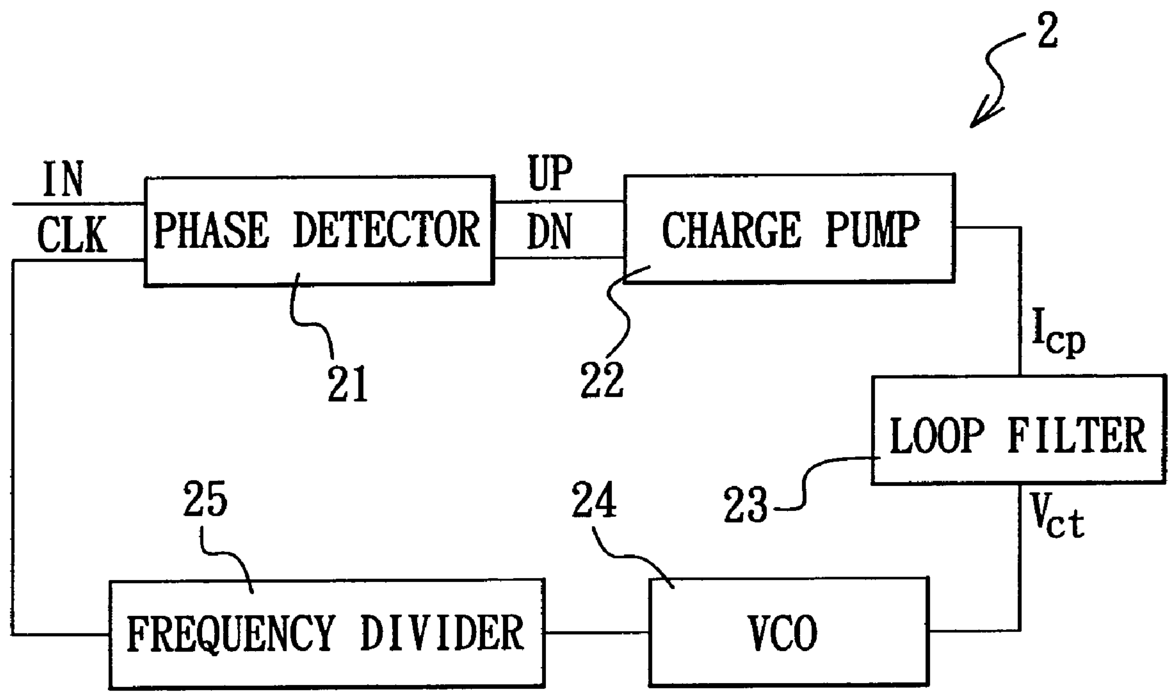
FIG. 2 is a schematic circuit block diagram of a conventional phase-locked loop employed during playback of the DVDRAM of FIG. 1.
Figure 3:
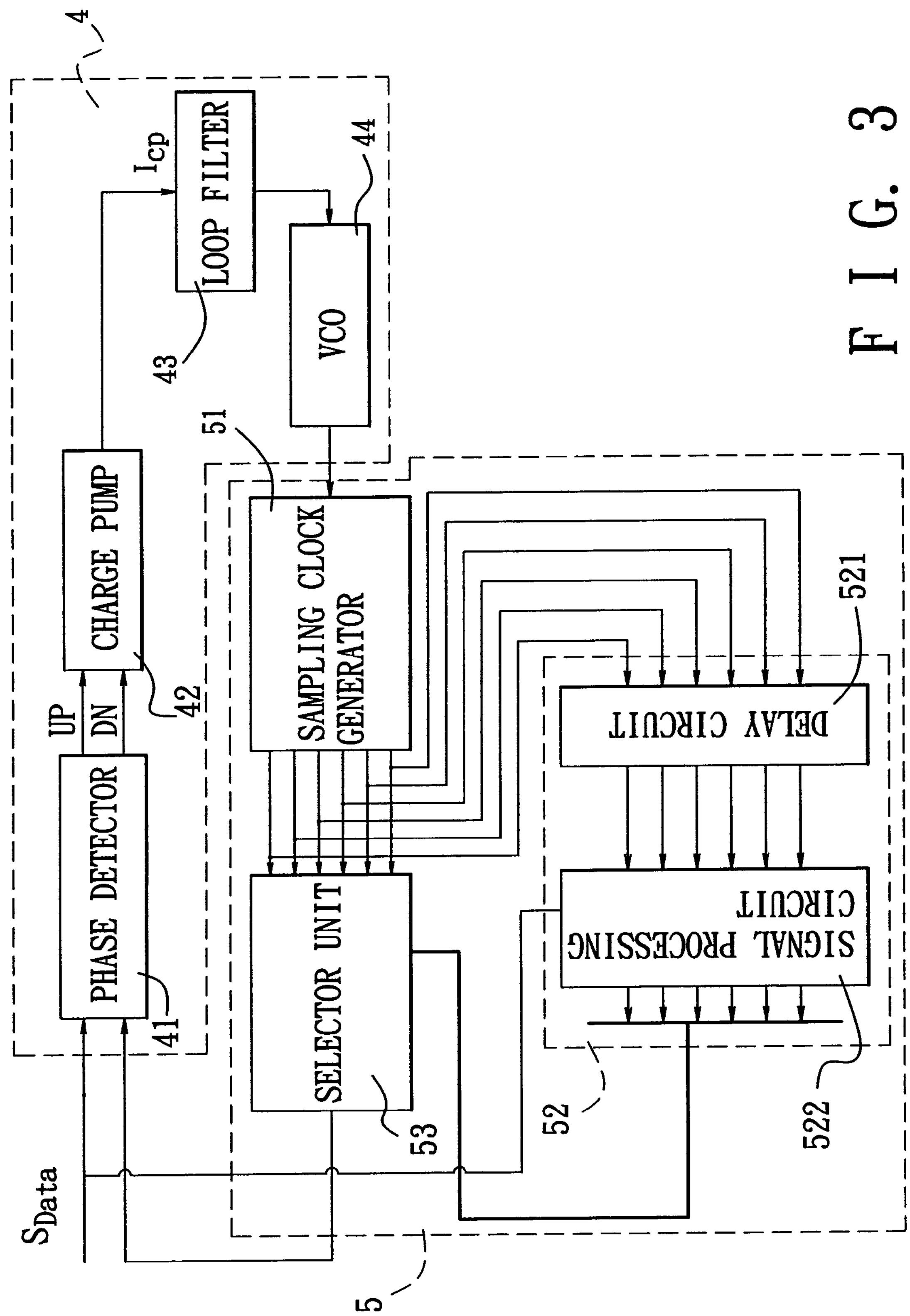
FIG. 3 is a schematic circuit block diagram showing the preferred embodiment of an apparatus according to the present invention, together with a phase-locked loop.

Referring to FIG. 3, the preferred embodiment of an apparatus 5 according to the present invention is shown together with a phase-locked loop 4. The apparatus 5 enables the phase-locked loop 4 to lock the clock phase of an input digital signal ($S_{DATA}$) associated with a rewritable digital versatile disc in a relatively short amount of time. As described in the foregoing, the phase-locked loop 4 includes a phase detector 41 for receiving the input digital signal ($S_{DATA}$) and an input phase-locking clock signal, a charge pump 42 coupled to the phase detector 41, a loop filter 43 coupled to the charge pump 42, and a voltage controlled oscillator (VCO) 44 that generates an oscillator output. Since the configuration and operation of the phase-locked loop 4 are well known in the art, a detailed description of the same is omitted herein for the sake of brevity.

As shown in FIGS. 3 and 4, the apparatus 5 includes a sampling clock generator 51, a detector unit 52, and a selector unit 53.

The sampling clock generator 51 is adapted to receive the oscillator output from the voltage controlled oscillator 44, and generates a number (N) of sampling clock signals in response to the oscillator output. The sampling clock signals generated by the sampling clock generator 51 have the same clock frequency and different clock phases. Each of the sampling clock signals forms a relative phase difference equal to 360/N degrees with another one of the sampling clock signals. While the number (N) is equal to 6 in this embodiment, the actual number should not be limited thereto. In practice, a higher number (N) of sampling clock signals may be set up for higher sampling precision requirements.

The detector unit 52 includes a delay circuit 521 coupled to the sampling clock generator 51, and a signal processing circuit 522 coupled to the delay circuit 521. The signal processing circuit 522 includes a sampling circuit 523 and a comparison circuit 524.

The sampling circuit 523 is constructed from D-type flip-flops F1, F2, F3, F4, F5, F6, . . . , is coupled to the delay circuit 521, and is adapted to receive the input digital signal ($S_{DATA}$). The sampling circuit 523 samples the input digital signal at the clock edges of the sampling clock signals to obtain multiple sampling points of the input digital signal ($S_{DATA}$). Temporally adjacent ones of the sampling points are spaced apart from each other by an interval.

The comparison circuit 524 is constructed from exclusive-OR logic gates G1, G2, G3, G4, G5 and G6, and is coupled to the sampling circuit 523 for comparing logic levels of each temporally adjacent pair of the sampling points to detect the presence of a logic level transition in the input digital signal ($S_{DATA}$). The logic level transition is a transition from one of high and low logic states to the other of the high and low logic states.

The selector unit 53 is coupled to the sampling clock generator 51 and the detector unit 52, and is controlled by the detector unit 52 to select one of the sampling clock signals from the sampling clock generator 51. The selected one of the sampling clock signals has one of the clock edges thereof defining the interval that was detected by the detector unit 52 to have occurrence of the logic level transition in the input digital signal ($S_{DATA}$). The selector unit 53 is further adapted to provide the selected one of the sampling clock signals to the phase detector 41 as the input phase-locking clock signal.

The operation of the apparatus 5 of this embodiment will now be described in greater detail with further reference to FIGS. 5 to 7.

Figure 5:
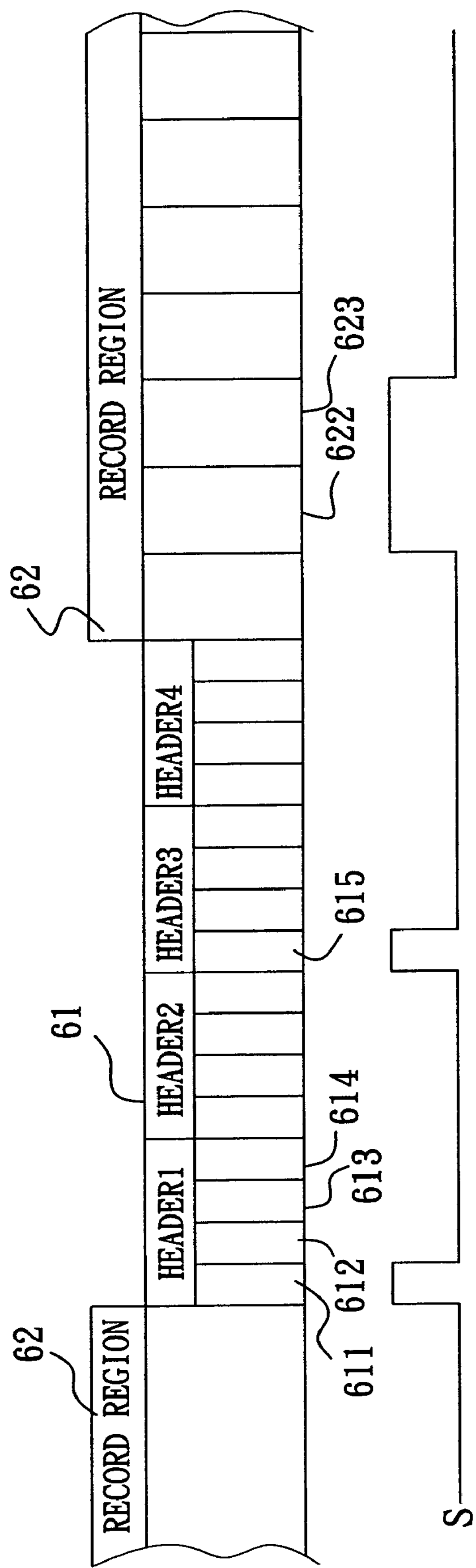
FIG. 5 is an exemplary waveform of an input digital signal associated with data recorded in a DVDRAM.
Figure 6:
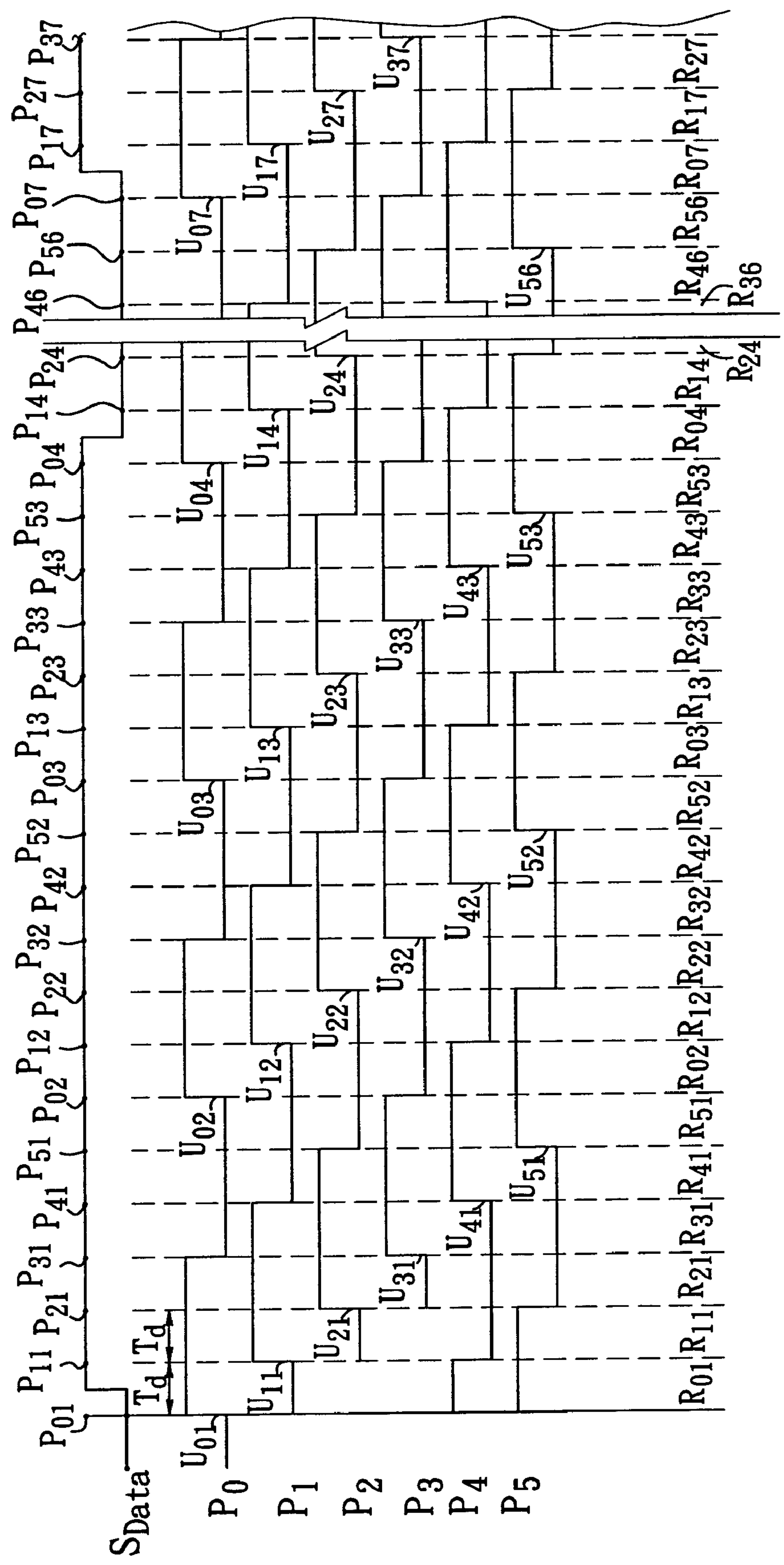
FIG. 6 is a timing diagram to illustrate the relationships of an input digital signal and exemplary sampling clock signals generated in the preferred embodiment.

When an optical playback system reads a blank area 611 in a header region 61 of a DVDRAM, a corresponding signal represented by a high-level pulse (S) is generated, as best shown in FIG. 5. The playback system reads the areas 611, 612, 613, . . . , in sequence to result in the input digital signal ($S_{Data}$) shown in FIG. 6. It should be noted herein that, while the areas 612, 613 in the header region 61 actually have data recorded therein, the contents thereof are not shown in FIG. 5 for the sake of simplicity. The input digital signal ($S_{DATA}$) is inputted simultaneously to the phase detector 41 of the phase-locked loop 4 and the sampling circuit 523 of the detector unit 52. At this moment, the flow of FIG. 7 begins at step 31.

In step 31, the voltage controlled oscillator 44 generates the oscillator output ($P_0$) that is provided to the sampling clock generator 51. The oscillator output ($P_0$) is a reference signal typically found in phase-locked loops and, as shown in FIG. 6, includes a plurality of clock pulses $U_{01}$, $U_{02}$, $U_{03}$, . . . $U_{07}$ for triggering operation of the sampling circuit 523.

Then, in step 32, the sampling clock generator 51 generates six sampling clock signals in response to the oscillator output ($P_0$) in the following manner: A first sampling clock signal ($P_0$) is generated by outputting the oscillator output ($P_0$) directly. The second sampling clock signal ($P_1$) is generated by introducing a delay period ($T_d$) into the first sampling clock signal ($P_0$). The third sampling clock signal ($P_2$) is generated by introducing the same delay period ($T_d$) into the second sampling clock signal ($P_2$). The fourth to sixth sampling clock signals ($P_3$, $P_4$, $P_5$) are generated in a similar manner. The six sampling clock signals are provided to the sampling circuit 523 through the delay circuit 521. Accordingly, the sampling circuit 523 receives clock pulses $U_{01}$, $U_{02}$, $U_{03}$, . . . $U_{07}$, $U_{11}$, $U_{12}$, $U_{13}$, . . . $U_{17}$, $U_{21}$, $U_{22}$, $U_{23}$, . . . $U_{27}$, $U_{31}$, $U_{32}$, $U_{33}$, . . . $U_{37}$, $U_{41}$, $U_{42}$, $U_{43}$, . . . $U_{47}$, $U_{51}$, $U_{52}$, $U_{53}$, . . . $U_{57}$, the total number of which is six times of that of the clock pulses of the oscillator output ($P_0$) . The clock pulses received by the sampling circuit 523 control the number of sampling operations to be performed by the sampling circuit 523 upon the input digital signal ($S_{Data}$).

In step 33, the clock pulses $U_{01}$, $U_{02}$, $U_{03}$, . . . $U_{07}$, $U_{11}$, $U_{12}$, $U_{13}$, . . . $U_{17}$, $U_{21}$, $U_{22}$, $U_{23}$, . . . $U_{27}$, $U_{31}$, $U_{32}$, $U_{33}$, . . . $U_{37}$, $U_{41}$, $U_{42}$, $U_{43}$, . . . $U_{47}$, $U_{51}$, $U_{52}$, $U_{53}$, . . . $U_{57}$ trigger the sampling circuit 523 for sampling the input digital signal ($S_{Data}$) at leading clock edges of the clock pulses, thereby resulting in multiple sampling points (forty-two in this embodiment) of the input digital signal ($S_{Data}$). Temporally adjacent ones of the sampling points are spaced apart from each other by an interval equal to the delay period ($T_d$) . The logic level of each sampling point is then outputted to the comparison circuit 524. Particularly, at the sampling point ($P_{01}$) of the input digital signal ($S_{Data}$) , the clock pulse ($U_{01}$) of the first sampling clock signal ($P_0$) triggers the flip-flop (F1) such that the logic level of the input digital signal ($S_{Data}$) detected by the sampling circuit 523 is a low logic level, and a low logic signal is provided by the sampling circuit 523 to one of two input terminals of the exclusive-OR logic gate (G1) of the comparison circuit 524. Subsequently, at the sampling point ($P_{11}$) f the input digital signal ($S_{Data}$) , the clock pulse ($U_{11}$) of the second sampling clock signal ($P_1$) triggers the flip-flop (F2) such that the logic level of the input digital signal ($S_{Data}$) detected by the sampling circuit 523 is a high logic level, and a high logic signal is provided by the sampling circuit 523 to the other one of the two input terminals of the exclusive-OR logic gate (G1) and to one of the two input terminals of the exclusive-OR logic gate (G2) of the comparison circuit 524. Likewise, at the sampling point ($P_{21}$) of the input digital signal ($S_{Data}$) , the clock pulse ($U_{21}$) of the third sampling clock signal ($P_2$) triggers the flip-flop (F3) such that the logic level of the input digital signal ($S_{Data}$) detected by the sampling circuit 523 is a high logic level, and a high logic signal is provided by the sampling circuit 523 to the other one of the two input terminals of the exclusive-OR logic gate (G2) and to one of the two input terminals of the exclusive-OR logic gate (G3) of the comparison circuit 524. Accordingly, at the succeeding sampling points ($P_{31}$, $P_{41}$, $P_{51}$, $P_{02}$, $P_{12}$, . . . $P_{47}$, $P_{57}$) of the input digital signal ($S_{Data}$) , the clock pulses $U_{31}$, $U_{41}$, $U_{51}$, $U_{02}$, $U_{12}$, . . . $U_{47}$, $U_{57}$ of the sampling clock signals trigger a corresponding one of the flip-flops (F1–F6) such that the sampling circuit 523 is able to sample temporally adjacent pairs of the sampling points of the input digital signal ($S_{Data}$) , such as $P_{21}$ and $P_{31}$, $P_{31}$ and $P_{41}$, $P_{51}$ and $P_{02}$, $P_{02}$ and $P_{12}$, . . . $P_{07}$ and $P_{17}$, $P_{17}$ and $P_{27}$. Each corresponding pair of sampled logic levels is outputted to a corresponding one of the exclusive-OR logic gates (G1–G6) in preparation for detection of a logic level transition in the following step 34. As shown in FIG. 6, the intervals of the adjacent pairs of the sampling points $P_0$, and $P_{11}$, $P_{11}$ and $P_{21}$, $P_{21}$ and $P_{31}$, $P_{31}$ and $P_{41}$, . . . $P_{07}$ and $P_{17}$, $P_{17}$ and $P_{27}$ are indicated as $R_{01}$, $R_{11}$, $R_{21}$, $R_{31}$, . . . $R_{07}$ and $R_{17}$.

In step 34, the comparison circuit 524 compares the logic levels of each temporally adjacent pair of the sampling points to determine the presence of a logic level transition. If the two logic levels are different, the flow goes to step 35. Otherwise, the flow goes to step 36. As shown in FIG. 6, a logic level transition from low to high occurs in the interval $R_{01}$ defined by the adjacent sampling points $P_{01}$, $P_{11}$, and in the interval $R_{07}$ defined by the adjacent sampling points $P_{07}$, $P_{17}$. A logic level transition from high to low is present in the interval $R_{04}$ defined by the adjacent sampling points $P_{04}$ and $P_{14}$. Due to the use of the exclusive-OR logic gates (G1–G6) in the comparison circuit 524, a high-level output will be generated whenever there is a logic level transition. As such, the interval detected to have the logic level transition occurring therein can be determined in step 35. All other adjacent pairs of the sampling points that define intervals with no logic level transition occurring therein will result in the generation of a low-level output from the corresponding exclusive-OR logic gate (G1–G6).

Step 37 follows step 35. In step 37, the selector unit 53 selects one of the sampling clock signals in accordance with the exclusive-OR logic gate (G1–G6) of the comparison circuit 524 that indicted the presence of a logic level transition. As evident from FIG. 6, the intervals $R_{01}$, $R_{04}$, $R_{07}$ are defined by clock edges of the clock pulses of the sampling clock signals $P_0$, $P_1$. This indicates that either one of the sampling clock signals $P_0$, $P_1$ has a phase that is very close to that of the input digital signal ($S_{Data}$) . Therefore, the selector unit 53 is designed to select one of the sampling clock signals $P_0$, $P_1$ and to provide the selected one of the sampling clock signals $P_0$, $P_1$ to the phase detector 41 as the input phase-locking clock signal.

In step 36, as long as no logic level transition in the input digital signal ($S_{Data}$) is detected, the selector unit 53 maintains a current input phase-locking clock signal to the phase detector 41.

In step 38, steps 31 to 37 are repeated until the current output of the charge pump 42 is zero, which indicates that the desired locked clock phase condition has been reached.

It is worthwhile to note that the selector unit 53 is constituted by a logic circuit and thus has an inherent delay time ($T_1$) . Therefore, the delay circuit 521 of the detector unit 52 can be configured to introduce the same delay time ($T_1$) into the sampling clock signals $P_0$, $P_1$, $P_2$, $P_3$, $P_4$, $P_5$ before receipt of the same by the sampling circuit 523 so that the selected clock signal provided by the selector unit 53 is also delayed by the delay time ($T_1$) . In this sense, the apparatus 5 provides a clock signal with almost no timing error to the phase-locked loop 4.

By following the aforesaid steps, the phase of the selected sampling clock signal, e.g., $P_1$, is very close to that of the input digital signal ($S_{Data}$) . Therefore, when the sampling clock signal ($P_1$) is used as the current phase-locking clock signal for the phase-locked loop 4, the phase-locked loop 4 only needs to adjust the phase difference between the input digital signal ($S_{Data}$) and the sampling clock signal ($P_1$) in order to achieve the desired locked clock phase condition within a very short amount of time.

Moreover, as shown in FIG. 5, when the optical playback system reads another blank area 615 in a header region 61 or other blank areas 622, 623 in a record region 62 of the DVDRAM, a corresponding signal represented by the high-level pulse (S) will be generated for triggering the apparatus 5 of this invention to perform the aforesaid method for enabling fast clock phase locking in the phase-locked loop 4.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A method for enabling fast clock phase locking in a phase-locked loop, the phase-locked loop including a phase detector for receiving an input digital signal associated with a rewritable digital versatile disc and an input phase-locking clock signal, and a voltage controlled oscillator that generates an oscillator output, said method comprising the steps of:

(a) in response to the oscillator output, obtaining multiple sampling points of the input digital signal, wherein temporally adjacent ones of the sampling points are spaced apart from each other by an interval;

(b) comparing logic levels of each temporally adjacent pair of the sampling points to detect presence of a logic level transition in the input digital signal; and (c) providing an adjusted input phase-locking clock signal for replacing a current input phase-locking clock signal to the phase detector, the adjusted input phase-locking clock signal corresponding to one of the sampling points in the temporally adjacent pair that was detected to have the logic level transition occurring in the interval of the temporally adjacent pair.

2. The method as claimed in claim 1, wherein step (a) includes:

generating a number (N) of sampling clock signals having the same clock frequency and different clock phases, each of the sampling clock signals forming a relative phase difference equal to 360/N degrees with another one of the sampling clock signals; and sampling the input digital signal at clock edges of the sampling clock signals to obtain the sampling points.

3. The method as claimed in claim 2, wherein, in step (c), the adjusted input phase-locking clock signal is selected from one of the sampling clock signals which has one of the clock edges thereof defining the interval that was detected to have the logic level transition occurring therein.

4. The method as claimed in claim 1, wherein the logic level transition is a transition from one of high and low logic states to the other of the high and low logic states.

5. A method for enabling fast clock phase locking in a phase-locked loop, the phase-locked loop including a phase detector for receiving an input digital signal associated with a rewritable digital versatile disc and an input phase-locking clock signal, and a voltage controlled oscillator that generates an oscillator output, said method comprising the steps of:

in response to the oscillator output, generating a number (N) of sampling clock signals;

sampling the input digital signal at clock edges of the sampling clock signals to obtain multiple sampling points of the input digital signal, wherein temporally adjacent ones of the sampling points are spaced apart from each other by an interval;

comparing logic levels of each temporally adjacent pair of the sampling points to detect presence of a logic level transition in the input digital signal; and selecting one of the sampling clock signals that is to be provided to the phase detector as the input phase-locking clock signal, the selected one of the sampling clock signals having one of the clock edges thereof defining the interval that was detected to have occurrence of the logic level transition in the input digital signal.

6. The method as claimed in claim 5, wherein the sampling clock signals have the same clock frequency and different clock phases, each of the sampling clock signals forming a relative phase difference equal to 360/N degrees with another one of the sampling clock signals.

7. The method as claimed in claim 5, wherein the logic level transition is a transition from one of high and low logic states to the other of the high and low logic states.

8. An apparatus for enabling fast clock phase locking in a phase-locked loop, the phase-locked loop including a phase detector for receiving an input digital signal associated with a rewritable digital versatile disc and an input phase-locking clock signal, and a voltage controlled oscillator that generates an oscillator output, said apparatus comprising:

a sampling clock generator adapted to receive the oscillator output from the voltage controlled oscillator, said sampling clock generator generating a number (N) of sampling clock signals in response to the oscillator output;

a detector unit coupled to said sampling clock generator and adapted to receive the input digital signal, said detector unit sampling the input digital signal at clock edges of the sampling clock signals to obtain multiple sampling points of the input digital signal, wherein temporally adjacent ones of the sampling points are spaced apart from each other by an interval;

said detector unit comparing logic levels of each temporally adjacent pair of the sampling points to detect presence of a logic level transition in the input digital signal; and a selector unit coupled to said sampling clock generator and said detector unit, said selector unit being controlled by said detector unit to select one of the sampling clock signals from said sampling clock generator, wherein the selected one of the sampling clock signals has one of the clock edges thereof defining the interval that was detected by said detector unit to have occurrence of the logic level transition in the input digital signal, said selector unit being adapted to provide the selected one of the sampling clock signals to the phase detector as the input phase-locking clock signal.

9. The apparatus as claimed in claim 8, wherein the sampling clock signals generated by said sampling clock generator have the same clock frequency and different clock phases, each of the sampling clock signals forming a relative phase difference equal to 360/N degrees with another one of the sampling clock signals.

10. The apparatus as claimed in claim 8, wherein the logic level transition is a transition from one of high and low logic states to the other of the high and low logic states.

11. The apparatus as claimed in claim 8, wherein said detector unit includes a signal processing circuit, said signal processing circuit including:

a sampling circuit for sampling the input digital signal at the clock edges of the sampling clock signals; and a comparison circuit coupled to said sampling circuit for comparing logic levels of each temporally adjacent pair of the sampling points.

12. The apparatus as claimed in claim 11, wherein said sampling circuit is constructed from flip-flops.

13. The apparatus as claimed in claim 12, wherein the flip-flops are D-type flip-flops.

14. The apparatus as claimed in claim 11, wherein said comparison circuit is constructed from exclusive-OR logic gates.

15. The apparatus as claimed in claim 11, wherein said detector unit further includes a delay circuit coupled to and disposed between said sampling clock generator and said signal processing circuit.

* * * * *